(12) United States Patent
Manohar et al.

(10) Patent No.: US 7,505,304 B2
(45) Date of Patent: Mar. 17, 2009

(54) FAULT TOLERANT ASYNCHRONOUS CIRCUITS

(75) Inventors: Rajit Manohar, Ithaca, NY (US); Clinton W. Kelly, Ithaca, NY (US)

(73) Assignee: Achronix Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/740,168

(22) Filed: Apr. 25, 2007

(65) Prior Publication Data

US 2007/0253240 A1    Nov. 1, 2007

Related U.S. Application Data

(60) Provisional application No. 60/796,125, filed on Apr. 27, 2006, provisional application No. 60/817,508, filed on Jun. 28, 2006, provisional application No. 60/817,335, filed on Jun. 28, 2006.

(51) Int. Cl.
*G11C 11/00* (2006.01)
*H03K 19/003* (2006.01)

(52) U.S. Cl. ........................... 365/154; 365/156; 326/9; 326/12

(58) Field of Classification Search ................. 365/156, 365/154

See application file for complete search history.

(56) References Cited

U.S. PATENT DOCUMENTS

| | | | |
|---|---|---|---|
| 6,958,627 B2 * | 10/2005 | Singh et al. | 326/93 |
| 7,036,059 B1 * | 4/2006 | Carmichael et al. | 714/725 |
| 7,050,324 B2 | 5/2006 | Cummings et al. | |
| 7,283,409 B1 * | 10/2007 | Voogel et al. | 365/200 |
| 7,301,362 B2 * | 11/2007 | Jang et al. | 326/9 |
| 7,307,450 B2 * | 12/2007 | Liang et al. | 326/39 |
| 7,345,511 B2 * | 3/2008 | Morgenshtein et al. | 326/122 |
| 2006/0090099 A1 | 4/2006 | Martin et al. | |
| 2007/0016823 A1 | 1/2007 | Jang et al. | |
| 2007/0253240 A1 | 11/2007 | Manohar et al. | |
| 2007/0262786 A1 * | 11/2007 | Manohar et al. | 326/14 |

FOREIGN PATENT DOCUMENTS

WO WO-2007127917 A2    11/2007
WO WO-2007127917 A3    11/2007

OTHER PUBLICATIONS

"International Application Serial No. PCT/US2007/067622, International Search Report mailed Jun. 5, 2008", 6 pgs.
"International Application Serial No. PCT/US2007/067622, Written Opinion mailed Jun. 5, 2008", 5 pgs.
Jang, Wonjin, et al., "SEU-tolerant QDI circuits—quasi delay-insensitive asynchronous circuits", *Proceedings—11th IEEE International Symposium on Asynchronous Circuits and Systems, 2005. ASYNC 2005.*, Dept. of Computer Science, California Institute of Technology, Pasadena, CA This paper appears in: Asynchronous Circuits and Systems, 2005. ASYNC 2005. Proceedings. 11th IEEE International Symposium on, (Mar. 14-15, 2005), 156-165.

* cited by examiner

*Primary Examiner*—Son L Mai
(74) *Attorney, Agent, or Firm*—Schwegman, Lundberg & Woessner, P.A.

(57) ABSTRACT

New and improved methods and circuit designs for asynchronous circuits that are tolerant to transient faults, for example of the type introduced through radiation or, more broadly, single-event effects. SEE-tolerant configurations are shown and described for combinational logic circuits, state-holding logic circuits and SRAM memory circuits.

10 Claims, 7 Drawing Sheets

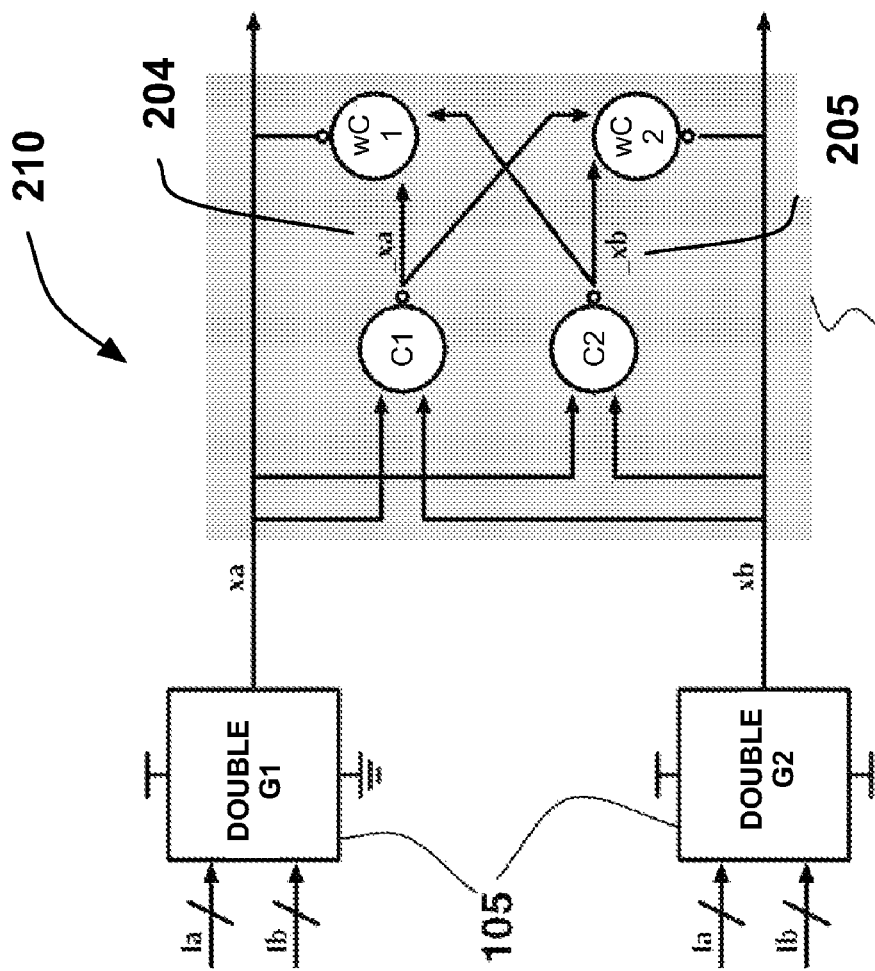
Fig. 2A
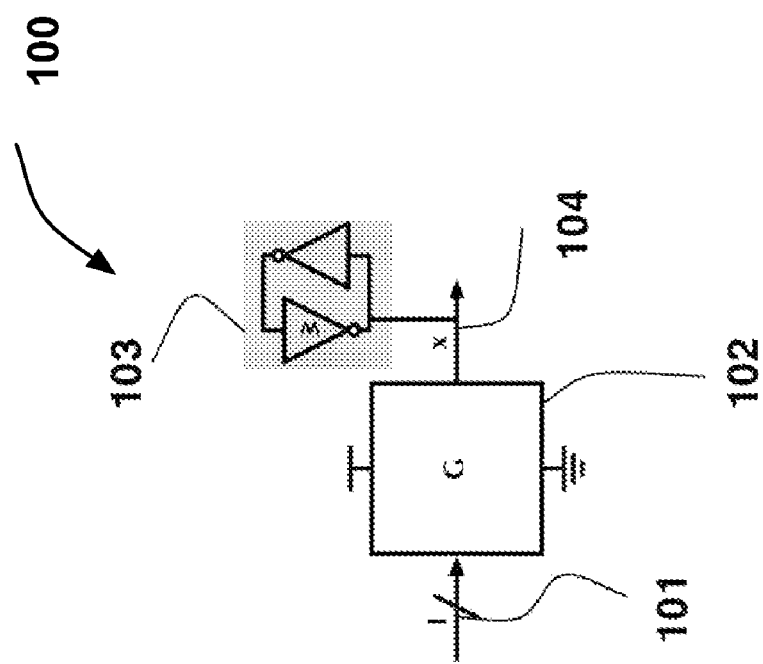
Fig. 1 *Prior Art*

FAULT TOLERANT ASYNCHRONOUS CIRCUITS

CROSS-REFERENCE TO RELATED APPLICATIONS

The present application claims the benefit of U.S. patent application Ser. No. 60/796,125 filed Apr. 27, 2006 and the benefit of U.S. patent application Ser. No. 60/817,335 filed Jun. 28, 2006 and the benefit of U.S. patent application Ser. No. 60/817,508 filed Jun. 28 2006, each of which is incorporated by reference herein in its entirety.

The present application relates to co-pending U.S. patent application Ser. No. 11/740,180 filed on same date herewith.

FIELD OF THE INVENTION

The present invention relates generally to electronic circuit design, and more specifically to fault tolerant asynchronous electronic circuits.

BACKGROUND OF THE INVENTION

Asynchronous circuits do not use a clock signal for their operation. Since the clock is not present, it cannot be used to filter "glitches" or data hazards. Therefore asynchronous circuits and in particular asynchronous control circuits do not function correctly if they have any switching hazards on their signals. A transient fault can be thought of as a temporary change in a signal value—a change that causes a "glitch" in the circuit. This error can propagate and create functionality issues, including deadlocks and/or incorrect data computation.

Radiation effects complicate matters, because the impact of ionizing radiation can disrupt circuit operation at more than one electrical node simultaneously. This is because the radius of impact of the particle might be significantly larger than the smallest features in a modern electronic circuit. Therefore, a "single event" can cause multiple signals that are physically proximate to change simultaneously. Various previous authors have experimentally established this phenomenon, the most direct observation being made in memories where a single particle strike can change the state of multiple adjacent memory bits.

The field of radiation hardened electronics is a widely published and patented field. Solutions to these problems fall into two solutions domains—Solutions that address total ionization dosage (TID) of radiation, and solutions that address single event effects SEEs. The present invention affects the latter because in the field of modern CMOS VLSI fabrication, TID solutions are achieved through customized processing of the underlying silicon materials.

There is significant prior art in the space of SEE fault tolerant electronics, but, to the best knowledge of the inventors, all of the prior art is designed for use with synchronous circuits and is not applicable to the field of asynchronous circuits, which are not restricted by the presence of a clock.

There is, to the best knowledge of the inventors, little prior art in the area of asynchronous fault tolerant circuits for SEE tolerance and single event upset (SEU) immunity. The only paper known to the present inventors to be relevant to the subject describes an alternative and less effective method for the implementation of SEE tolerant quasi delay insensitive circuits in the presence of high radiation environments. See California Institute of Technology, *SEU-tolerant QDI Circuits*, by Jang, W. and Martin, A. J.

There thus exists a need in the art for addressing SEE and SEU faults in asynchronous circuits.

SUMMARY OF THE INVENTION

The present invention is a circuit design technique to make asynchronous circuits tolerate transient faults that can be introduced due to a variety of effects, including radiation effects such as single-event upsets (SEUs) or more broadly single-event effects (SEEs).

In accordance with the present invention, there are provided methods and systems for a fault tolerant SRAM circuit, an exemplary apparatus comprising:
  a read circuit;
  a write circuit;
  a staticizer circuit, comprising:
    first and second C-elements each connected to each of the read and write circuits; and
    third and fourth C-elements each connected to the output of each of the first and second C-elements and to the read and write circuits;
    whereby the staticizer circuit functions to prevent a single write from changing the overall state of the SRAM during a time-limited fault.

By building a circuit family that is immune to SEEs, the present inventors provide a circuit technology that has a wide range of applications in space flight, military, and high radiation industrial applications.

DESCRIPTION OF THE DRAWING FIGURES

These and other objects, features and advantages of the present invention will be apparent from a consideration of the following Detailed Description Of The Invention in conjunction with the drawing Figures, in which:

FIG. 1 is a circuit diagram showing of a prior art combinational logic circuit including a holding element in accordance with the prior art.

FIG. 2A is a circuit diagram illustrating a state-holding SEE immune gate in accordance with a first embodiment of the invention.

FIG. 8 is a circuit diagram of a state—holding cell for an SRAM circuit.

DETAILED DESCRIPTION OF THE INVENTION

Figure 2B:
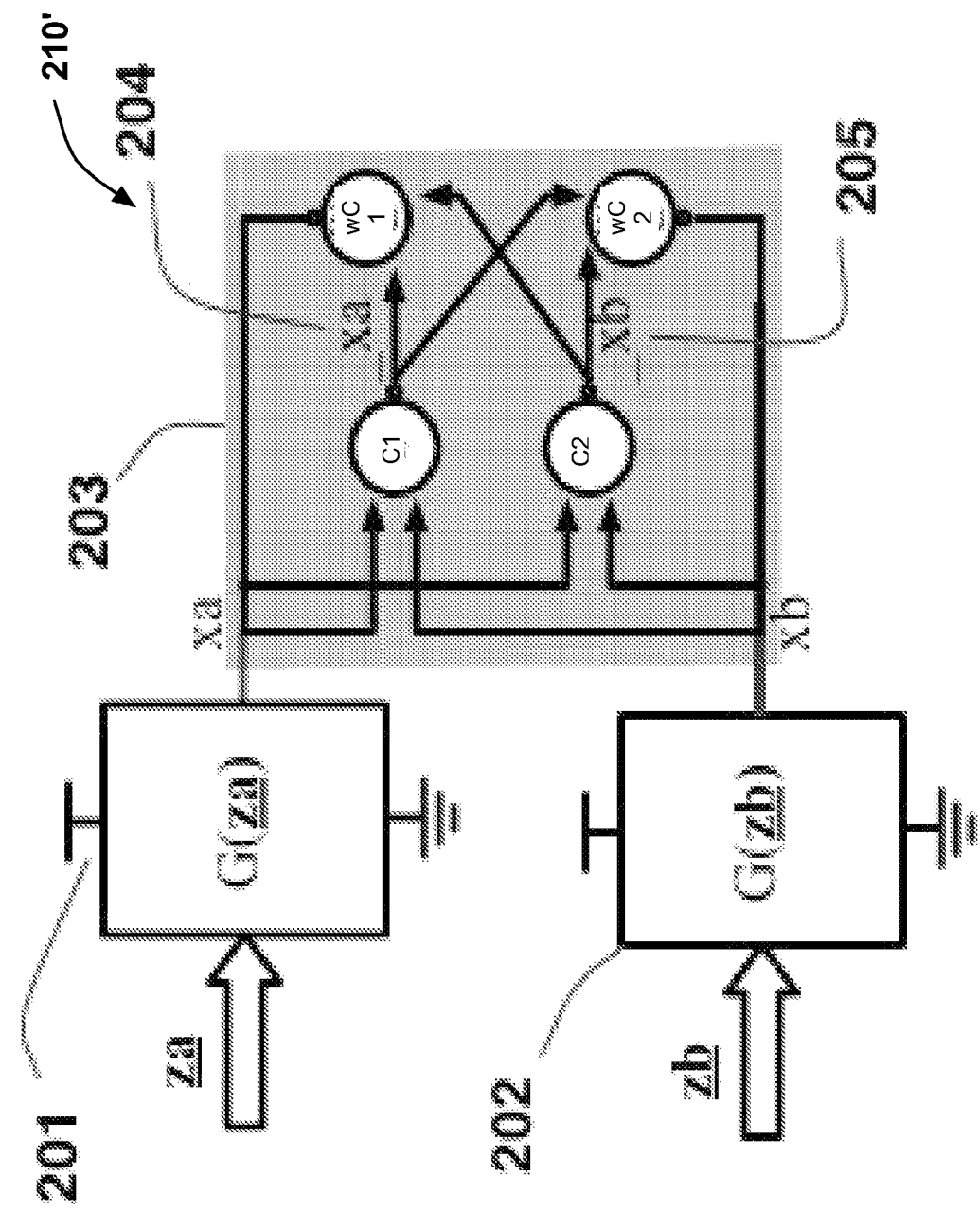
FIG. 2B is a circuit diagram illustrating a state-holding SEE immune gate in accordance with another embodiment of the invention.

The invention is directed to circuit design techniques, and the associated methods and circuits, for making asynchronous circuits tolerate transient faults that can be introduced due to a variety of effects, including radiation effects such as single-event upsets (SEUs) or more broadly single-event effects (SEEs).

In a manner well known in the art, a SEE results from a single, energetic particle. An SEU is a radiation-induced error in a microelectronic circuit caused when charged particles lose energy by ionizing the medium through which they pass, leaving behind a wake of electron-hole pairs. An undetected and hence uncorrected SEU can result in a microelectronic circuit generating an incorrect signal value.

As used herein, examples and illustrations are exemplary and not limiting.

While certain logic chips may include both clocked synchronous circuits and un-clocked asynchronous circuits on the same chip, the asynchronous circuits do not use a clock signal for their operation. Since the clock is not present, it cannot be used to filter "glitches" or data hazards. Therefore asynchronous circuits and in particular asynchronous control circuits cannot have any switching hazards on their signals. A transient fault can be thought of as a temporary change in a signal value-a change that causes a "glitch" in the circuit. This error can propagate and create functionality issues, including deadlocks and/or incorrect data computation.

Radiation effects complicate matters, because the impact of ionizing radiation can disrupt circuit operation at more than one electrical node simultaneously. This is because the radius of impact of the particle might be significantly larger than the smallest features in a modern electronic circuit. Therefore, a "single event" can cause multiple signals that are physically proximate to change simultaneously. Various previous authors have experimentally established this phenomenon, the most direct observation being made in memories where a single particle strike can change the state of multiple adjacent memory bits.

Existing methods for synchronous logic partially address this problem by using common techniques such as triple-modular redundancy, where a circuit is replicated three times and the final result is obtained by voting. If at most one circuit malfunctions, the overall result is unaffected because the correct result is generated by two of the circuits—thereby, out-voting the incorrect version. These techniques cannot be easily adapted to asynchronous logic, because an additional problem in asynchronous logic is that an SEE can cause the circuit to deadlock—making voting difficult because one of the three inputs to the voter may not arrive.

The invention is directed to a new circuit technique to combat transient faults, and in particular SEEs. (We will use the acronym SEEs to include arbitrary transient faults, including radiation-induced transient faults.) We exploit the fact that certain classes of asynchronous circuits are tolerant to changes in propagation delay in the gates. Example circuit families include speed independent circuits, some self-timed circuits, and quasi delay-insensitive circuits.

For example, assume we have a gate that can be described by a pull-up network (that can set the output high) and a pull-down network (that can set the output low). A gate is characterized by the Boolean conditions under which the two networks are conducting. A gate is said to be combinational when either the pull-up network or pull-down network is conducting no matter what the state of the system is. Otherwise, if the pull-up network or pull-down network is not conducting, that is, if there is a state where the pull-up or pull-down network is not conducting, a gate is said to be state-holding.

An SEE can cause the output of the gate to change its value (if the value doesn't change, we can ignore the SEE). This might cause the rest of the asynchronous circuit to malfunction. To prevent this, we introduce a replica of the gate. This replica must be designed in a way that prevents it from being affected by the same SEE as the original gate. Two nodes that must have independent faults in order to each be affected by a fault are said to be independent nodes. When an SEE occurs in this replicated structure, only one of the two gates will be affected by the SEE. The output of the two gates will disagree. We can now modify the other gates in the system so that when two replicas of a single signal disagree, the gates wait for the two to agree before using their value. This observation is known and can be found in a variety of publications. See, for example, the reference by Jiang and Martin discussed above. The present invention is a novel circuit technique for implementing this principle that is significantly more efficient than existing techniques, and provides robustness to SEEs that previously proposed solutions cannot tolerate.

Construction

We construct a first embodiment of a SEE-tolerant circuit in the following way. First, every signal in the circuit is replicated. This creates two copies of every node in the original circuit. For each node x in the original circuit, we denote the two replicas by xa and xb. The nodes xa and xb must be independent, and this has implications for the physical design of the circuit.

If x is combinational, the gates for xa and xb are the same as the original gate, except all inputs for the gate for xa correspond to nodes that have an "a" label, while all inputs to the gate for xb correspond to nodes that have a "b" label. Indeed, we can apply this to any connected set of combinational gates—the entire connected set of gates is duplicated, and one set is labeled "a" while the other set is labeled "b". In this case, all the signals in one set of combinational logic gates must be independent from all the signals in the other set of combinational logic gates. (Normally, only signals with the same name and differing labels are required to be independent.)

If x is state-holding, then it contains both the pull-up and pull-down network, plus an extra state-holding element called a staticizer or a keeper. Both must be modified for the circuit to be SEE-immune. We describe several different mechanisms to make the gate for x SEE-immune.

The first mechanism replaces every transistor in the pull-down and pull-up network with two transistors in series. If the gate input to one of the original transistors was g, the inputs to the two transistors that replace it are ga and gb. After this transformation, the gates can be re-ordered as long as they still implement the same Boolean condition for conduction of the pull-up/pull-down network. This part of the first mechanism is previously known. In contrast, the present invention provides a new and improved staticizer circuit. We discuss first the structure shown in FIG. 1.

FIG. 1 is representative of the prior art, showing a circuit 100 including an original gate 102, with original inputs 101 and output 104 along with a staticizer 103 that is used to hold state. In accordance with the present invention, both are modified for the circuit to be SEE-immune. The original prior art gate 102 is shown, with it original inputs 101 labeled I (inputs may include multiple signals) and output 104 labeled x along with a staticizer (also known as a keeper) 103 that is used to hold state. The symbol G( ) is used to denote the function and geometry of the gate and is parameterized by the input signals.

With reference now to FIG. 2A, in accordance with an embodiment of the present invention, a SEE immune version of a logic circuit 210 equivalent in function to that of FIG. 1 contains a replicated version of the gate 105. In this embodiment of the invention, each transistor in the original gate 102 is replaced by two series transistors in each of gates 105, as described above. The input signals a and b (Ia, Ib) are split between the two double-transistor gates indicated as double G1 and double G2. The two transistors are used to/provide the benefit of fault immunity, as is known, whereby if a fault causes the input of one of the transistors to change, the use of two transistors in series (the 'double' G1 and G2) will prohibit the circuit output from changing. The duplication of the combinational function through the use of both G1 and G2 is used with the inventive staticizer described below to increase error resistance.

The symbol "C" is used to indicate a C-element, and "wC" is used to indicate a weak C-element—a gate with reduced drive strength compared to an ordinary gate. While "C" and "wC" are used throughout to indicate the C-elements, they do not necessarily indicate identical configurations but are as described with respect to each circuit description.

Figure 6:
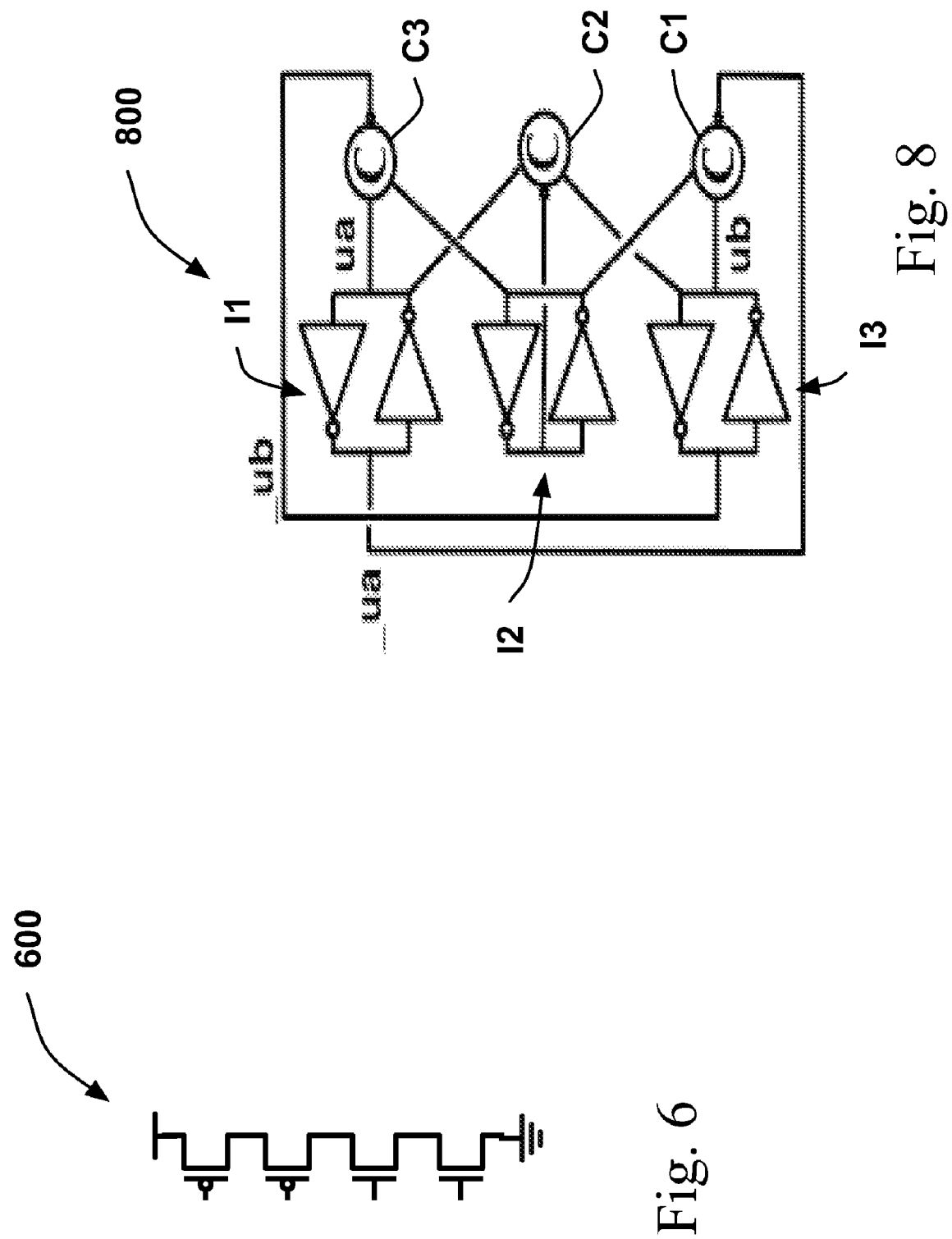
FIG. 6 is a circuit diagram of a C-element.

In a manner well known in the art, a C-element is a commonly used asynchronous logic component that applies logical operations on the inputs and may have hysteresis. The output of the C-element reflects the inputs when the states of all inputs match. The output then remains in this state until the inputs all transition to the other state. Types include an asymmetric C-element where some inputs only effect the operation in one of the transitions (positive or negative). An exemplary C-element, well known in the art, is shown in FIG. 6. In a weak wC C-element, the structure and operation of the circuit is the same as a C-element except the current drive strength of the gate is reduced so that it can be overpowered by a normal gate. It will be understood by the reader that 'weak' circuit elements are used where it is desirable for a principal circuit output to 'overpower' a weak circuit element for some period of time.

Signals xa and xb are seen to both be connected to the inputs of C1 and C2. Signals xa and xb are individually connected to the inverting input of wC1 and wC2, respectively. The outputs of C1 and C2 support the signals _xa and _xb which are connected and cross-connected to wC1 and wC2.

Continuing to consider the circuit of FIG. 2A, the outputs are xa and xb. As opposed to the prior art, we use the gate outputs directly for the rest of the circuit, which significantly improves the performance of the SEE immune state-holding gate. In this structure, every signal that is labeled "a" must be independent from its corresponding signal labeled "b", including the inputs to the weak C-elements (_xa and _xb). For safety, we do not directly use the output xa or xb from the gates 105 as inputs to the wC elements, but rather the complemented senses _xa (signal 204) and _xb (signal 205). If the original senses are needed, we can simply place an inverter on the complemented senses to recover the original sense of the signal.

In operation, if there are no single-event effects, the gate from FIG. 2A operates just like the original gate from FIG. 1 because all the "a" and "b" signals are always in agreement. If there is a single-event upset, then some "a" node will differ from its corresponding "b" node. If this occurs at the input to the gates 105, the series transistor combination in the doubled gate structure can only cause the output of the gate to be state-holding until the error corrects itself. This prevents the error from propagating. If the error occurs at the output "xa" or "xb", then the "_xa" and "_xb" signals are still correct because they are generated from C-elements. The weak C-elements will correct the output in this scenario if the doubled gates G1/G2 are in a state where they are not driving the output. If they are driving the output, they will correct the output eventually. Similarly, an error on "_xa" or "_xb" will be corrected by the C-elements driving them. Finally, error propagation is blocked at the next doubled gate. With the doubling of the transistors, the replicating of the gate and the use of the inventive staticizer circuit 106, the circuit is thus seen to be immune to SEE's on both the inputs and outputs.

With reference now to FIG. 2B, in accordance with another embodiment of the present invention, a SEE immune version of a logic circuit 210' equivalent in function to that of FIG. 1 contains a variation of circuit 210 of FIG. 2A, wherein the gates 201, 202 are each identical to gate 102 of FIG. 1. Features and advantages of the invention arise from the way we use the cross-coupled C-elements (also known as consensus elements) 203 to replace the state-holding staticizer 103, the state-holding element 203 configured substantially identical to that of 106 above (FIG. 2A). The symbol "C" is used to indicate a C-element, and "wC" is used to indicate a weak C-element—a gate with reduced drive strength compared to an ordinary gate. For safety, we do not directly use the output xa or xb from the gate, but rather the complemented senses _xa (signal 204) and _xb (signal 205) are used as the output of the circuit. If the original senses are needed, we can simply place an inverter on the complemented senses to recover the original sense of the signal. In operation, in comparison to the circuit 210 of FIG. 2A, an error on the input to the gate G is not blocked by doubling the transistors. Instead, the error propagation is prevented by using "_xa" and "_xb" as the output (possibly followed by an inverter if the other sense of the signal is needed). The C-elements in the FIG. 2B block the error propagation. While not as immune to SEE's, this embodiment of the invention significantly improves the efficiency of the circuit because the number of transistors in series in the logic circuits 201 and 202 is unchanged over the original logic circuit 102.

Features and advantages of the invention arise from the way we use the cross-coupled C-elements (also known as consensus elements) 203 to replace the state-holding staticizer 103.

Figure 3:
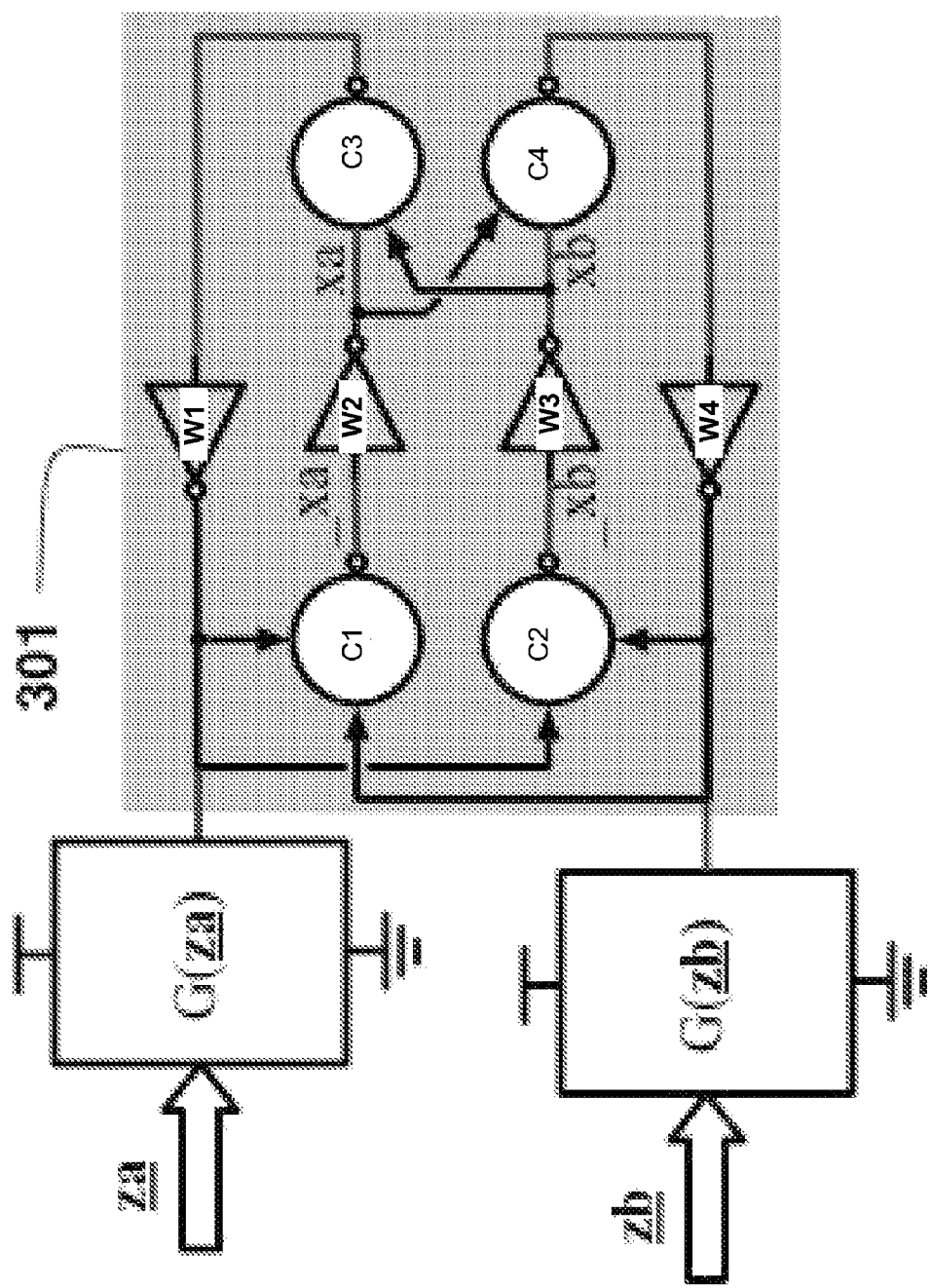
FIG. 3 is a circuit diagram illustrating a state-holding SEE immune gate in accordance with another embodiment of the invention.

In an alternate embodiment of the invention shown in FIG. 3, there is used a slightly modified keeper circuit 301 with the C-elements connected substantially identically to those described above and that has the additional property that the input and output of each C-element in the keeper is spaced by a gate that is combinational, indicated at W1, W2, W3 and W4. Since inverters are already present in this circuit, we can simply use those signals as the output of the gate without introducing any additional inverter externally. It will be understood that in this configuration only the gate needing to be overpowered by the main gate is a 'weak' gate, here the inverters so they can be overpowered by the logic circuit G. In operation, with these combinational gates inserted at the output of the C elements, the circuit behaves much like the original circuit in FIG. 2B or FIG. 2A depending on which alternative is chosen in combination with the new keeper. This keeper circuit has an additional benefit in modern CMOS processes that have small transistor geometries. In this particular keeper, the insertion of the inverters physically separates the inputs and outputs of the C-elements, such that a single event effect that causes both the input and output of a gate to change is also tolerated. This is not true for the previous keeper circuits in FIG. 2A and FIG. 2B. Hence, this structure provides greater robustness. It will be understood that only the gate needing to be overpowered by the main gate is a 'weak' gate, here the inverters so they can be overpowered by the logic circuit G.

The reader will appreciate that the modified keeper, or staticizer, circuits described with respect to FIGS. 2A, 2B and 3 provide the SEE immune advantages of the present invention.

Generalized Multi-Path Logic

This method can be generalized for additional robustness by providing k replicas of the original circuit instead of simply two replicas. For combinational logic, this is straightforward because we simply construct k replicas of the logic where originally there was one copy only. For state-holding logic, the first part of the construction also simply contains k replicas of the state-holding gate. The keeper circuit, however, must be generalized.

Figure 4:
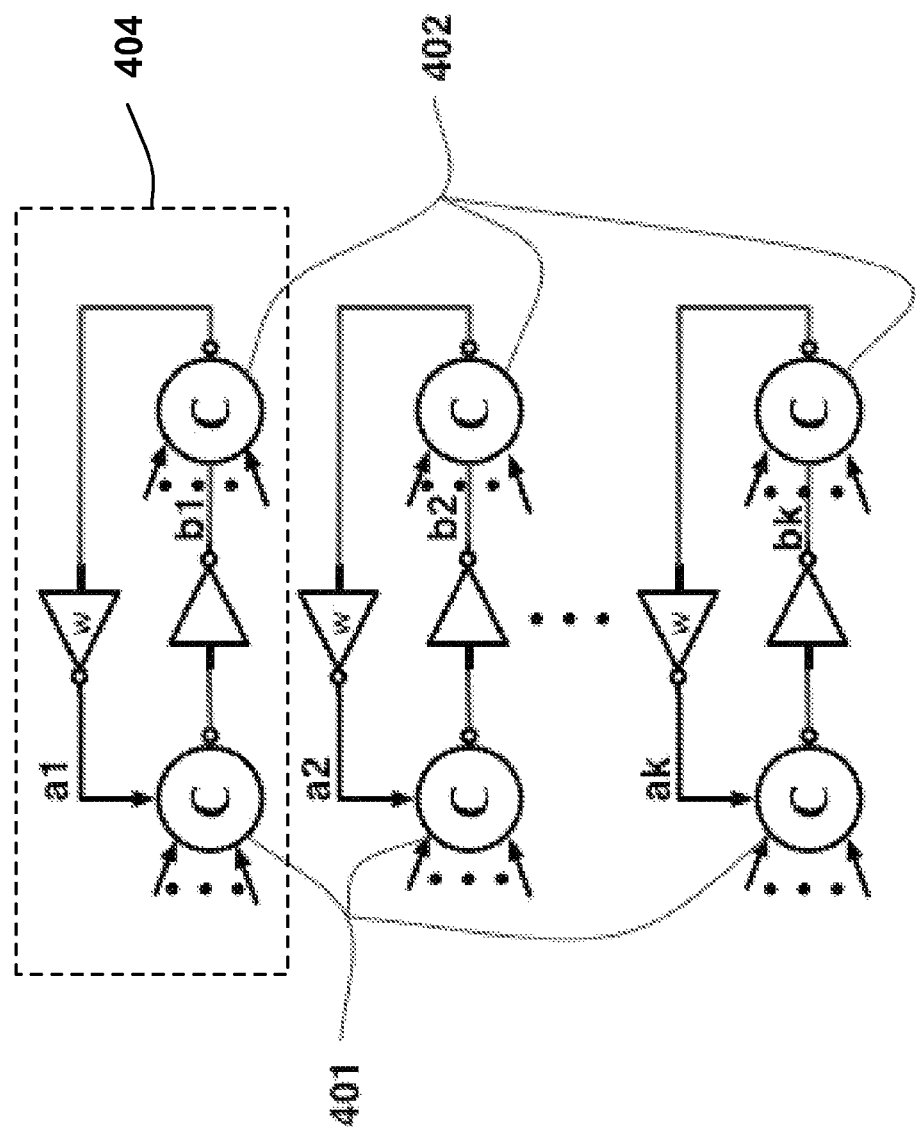
FIG. 4 is a circuit diagram showing a generalized C-element keeper in accordance with an embodiment of the invention.

With reference to FIG. 4, the generalized keeper circuit contains k-input C-elements instead of simply two-input C-elements. For purposes of illustration we show the generalized keeper of FIG. 4 containing the additional inverters (corresponding to keeper 301 in FIG. 3). It will be understood that a simplified keeper is obtained by simply eliminating the inverters. Gates 401 are all k-input C-elements, having inputs a1, a2, . . . , ak. Gates 402 are also k-input C-elements having inputs b1, b2, . . . , bk. The "a" inputs are all connected to their corresponding replica gate, as in the dual-path case (shown in FIG. 3). In this illustration, the "b" inputs to the second set of C-elements are the inverted "outputs of the initial C-elements. The reader will appreciate that, while the illustration has been limited for purposes of description, the replication of each keeper branch 404 occurs two-dimensionally in parallel (as shown) and series based on the number of simultaneous faults the circuit must tolerate.

We refer to this SEE-immune circuit as a multi-path logic circuit, as there are multiple paths that compute the same signals in parallel with occasional synchronization and cross-checking between the paths using C-element circuits.

Replicated Circuit

Figure 5:
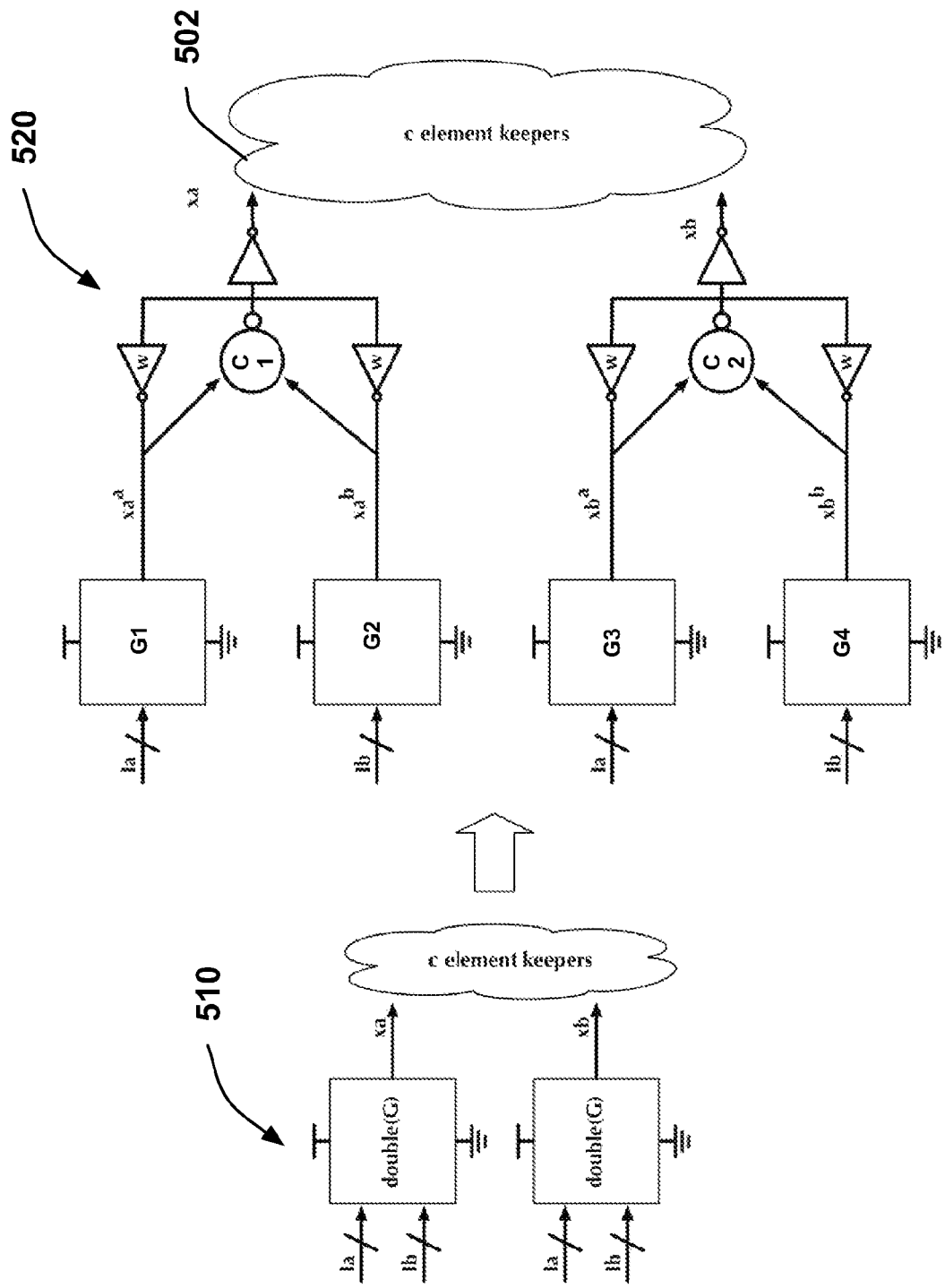
FIG. 5 is a circuit diagram illustrating a state-holding SEE immune gate in accordance with another embodiment of the invention.

Another embodiment of the present invention includes a decomposed version of the SEE-immune gate shown in FIG. 1. This mechanism does not use the two series transistor substitution as shown in FIG. 2A. Instead, the original gate element is replicated four times and C-elements are used to combine the outputs into the final xa and xb signals. With reference to FIG. 5, a general representation 510 of the circuit of FIG. 2A is shown decomposed and replicated four times as G1, G2, G3, G4 in the circuit 520. Each original gate is replicated four times: twice where the inputs are replaced with signals that have the "a" label, and twice when the inputs are replaced with signals that have the "b" label. The four gate outputs are $xa^a$, $xa^b$, $xb^a$, $xb^b$ where the superscript denotes the labels of the input signals that are used to generate the appropriate output. The signals are combined using C-elements to generate the signals xa and xb, and it will be seen that the inverted outputs of the C elements C1 and C2 are i) inverted and fed back to the respective outputs of the gates G1, G2, G3 and G4 and ii) inverted to generate signals xa, xb. Finally, a keeper structure 502 described below, is used as a state-holding element for xa and xb.

While at first this structure of circuit 520 may appear larger, the gates themselves have the same number of transistors as before. The only additional transistors are in the explicitly drawn C-elements and inverters. Also, an analysis shows that this gate will likely have a desirably low delay, because each of the gates labeled G have half as many transistors in series compared to the structure of FIG. 2A they replace. However, for this circuit to be SEE-immune, we must assume that all the Ia inputs are independent from the Ib inputs, as well as xab; the three other independence conditions are symmetric. In other words, we introduce additional independence requirements between signals that were not present before, just like the case of combinational logic.

It will be appreciated that a problem with this implementation of circuit 520 can occur when there is a radiation-induced SEE event that might flip both the input and output of one of the C1, C2 C-elements. In that case, the keeper circuit becomes state holding and is unable to restore the output signals to their correct value. Normally we could assert that the input and output of the C-elements are independent; however, this may not be possible to implement because of the physical geometry constraints imposed by a transistor-level implementation—the source/drain region connected to the output of a C-element will be immediately adjacent to a gate that is connected to one of its inputs. To separate the output of the C-element from its input, we suggest the use of the keeper circuits including the inverter elements as shown in FIGS. 3 (circuit 301) and 4.

The invert-based keepers C1, C2 can be combined with any of the keeper circuit 502 solutions described above that contain a C-element keeper, to increase the robustness of the circuit to SEEs, for example 103 (FIG. 1), 106 (FIG. 2A), 203 (FIG. 2B) or 301 (FIG. 3).

SRAM See-Immune Configuration

Figure 7:
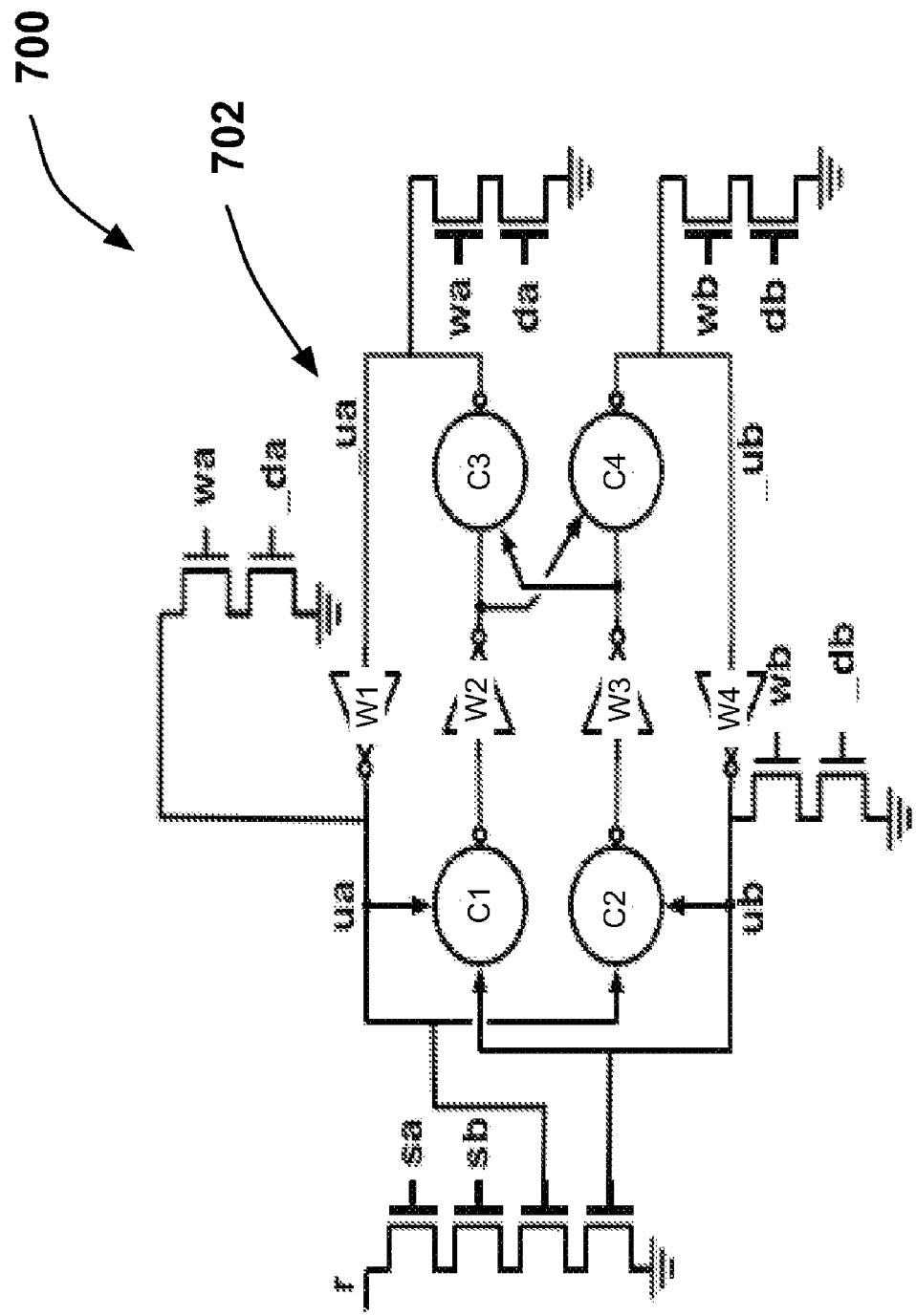
FIG. 7 is a circuit diagram of a fault—tolerant SRAM circuit.

With reference now to FIG. 7, there is shown an SRAM circuit configuration comprising a hybrid of SEE-immune configurations between the circuits of FIGS. 2A and 2B above, with double-transistor read circuits (r) and single transistor write circuits (w). The staticizer circuit 702 is substantially identical to that of FIGS. 3 and 4, though it will be understood that in different embodiments the inverters W1-W4 may be omitted. The read circuits are connected to the ua, ub signal rails and the write circuits wa, wb to both the ua, ub and _ua, _ub signal rails. FIG. 7 shows a single read line r. This signal can also be shared across multiple bit-cells as is common in a conventional SRAM. If there is sufficient capacitance on signal r, then it may be immune to SEE effects; otherwise, the n-transistor chain for r can be replicated to generate two read lines ra and rb.

If there is sufficient capacitance on the data signals da, db, _da, _db to prevent any SEE-effects from changing their state, then da can be connected to db and _da can be connected to _db.

In this embodiment the transistor widths for the write transistors are chosen to be large enough to overwrite the state of the cell. The C-elements in the circuit are used to cross-check the value of the state. In particular, the top half and bottom half of the circuit must be separated to prevent simultaneous bit-flips in the two parts of the circuit. The amount by which the two halves are separated is a function of the types of errors that the circuit is designed to tolerate. Errors can be caused by a variety of physical effects, such as cross-talk, coupling, cosmic rays, or particle hits. Each physical effect has a certain physical region it can affect, called its region of influence. For instance, a particle hit would impact a region that is determined by the size of the particle, its energy, and the materials it is interacting with. The separation amount for the two halves of the circuit must be chosen so that an individual physical effect will never have a region of influence that includes both halves of the circuit. This can be achieved by physically separating the structure of the two halves of the circuit within the semiconductor substrate in which they are formed.

To write to the cell in FIG. 1, the write select signals are set high and either (0,1) or (1,0) is driven on both pairs (da,_da) and (db,_db). As long as there is a window of time that is SEE-free that is sufficient to write the state of the SRAM cell, the cell will be correctly written. When the cell is written, two nodes are driven low via the write circuitry. In the presence of an upset, only one of those nodes will be correctly written. The C-elements in the circuit will prevent a single write from changing the overall state of the SRAM cell. Therefore, as soon as the upset is eliminated both nodes will be written correctly, and the C-elements will allow the state change to proceed. The window of time needed to complete the write is governed by the time taken to set the two directly written nodes to ground, followed by the delay required for the feedback loop containing the four C-elements to change state. Removal of the write signals results in the cell holding state even in the presence of additional SEE effects.

Voting SEE-Immune Configuration

FIG. 8 shows an alternative cell for the state-holding part of an SEE-immune SRAM cell. Transistor sizes are selected for the C-elements so that they can overwrite the cross-coupled inverter pairs. Signals ua, ub, _ua, _ub correspond to the same signals from FIG. 7. Reads and writes to this cell can be performed using the same circuits as shown in FIG. 7; these read and write circuits are omitted for clarity.

C-elements C1, C3 are cross-connected between the signals ua, _ub (C1), _ua, ub (C2) and both to C2. Each C-element C1-3 has an associated parallel-pair set of inverters I1, I2 and I3 associated therewith buffering the input signal and the cross-connection to C2.

In operation, the central C-element acts as a 'voting' element to resolve discrepancies between the ua C-element and the ub C-element, as follows:

In the event of an error in the central C-element, the upper and lower ua and ub C-elements agree and feed the correct signal into the central C-element.

In the event of an error in the upper ua C-element, the central and lower ub C-elements are in agreement and set the output.

In the event of an error in the lower ub C-element, the central and upper ua C-elements are in agreement and set the output.

Synchronous solutions to the SEE problem involve having multiple copies of the logic and then a voter circuit that resolves discrepancies between the copies. For instance, a TMR scheme involves three replica circuits and a majority voter. A fundamental difference between these techniques and the invention is that the fixed frequency of synchronous logic imposes a timing window of vulnerability—if an upset occurs right near a clock edge, the recovery logic may not be able to correct it. The present invention provides methods and systems for SRAM circuits that wait for the upset to be corrected before continuing execution.

Pass-Transistor Circuits

In addition to the circuits described herein above, an asynchronous circuit can also use pass-transistor logic. A pass transistor connects two nodes in the circuit using either a single n-type transistor or p-type transistor (n-type or p-type transmission gate) or both an n-type and p-type transistor connected in parallel (full transmission gate).

There are two techniques that can be applied to make a transmission gate circuit SEE-immune. In the first technique, k pass transistors in series replace each pass-transistor, where the gates of the pass transistors correspond to the replicas of the original gate signal. These replicas are then copied to each of the k logic paths in the multi-path circuit. In the second technique, we simply replicate the pass transistors rather than using k pass transistors in series. The pass transistors in the i$^{th}$ replica are gated by the ith copies of the gate signal.

Additional Features and Advantages of the Invention

Synchronous solutions to the SEE problem involve having multiple copies of the logic and then a voter circuit that resolves discrepancies between the copies. For instance, a TMR scheme involves three replica circuits and a majority voter. A fundamental difference between these techniques and the invention is that the fixed frequency of synchronous logic imposes a timing window of vulnerability—if an upset occurs right near a clock edge, the recovery logic may not be able to correct it. Our approach involves only two copies (not three—the minimum required for voting), and the asynchronous logic simply waits for the two copies to agree before continuing execution.

The prior art of Jiang and Martin as described above discloses a scheme that uses two series transistors for each original transistor in the circuit, as well as two C-elements on the output. The proposed approach differs because: (i) We do not replicate series transistors in combinational logic; (ii) The decomposition in some embodiments eliminates the two series transistor construction for state-holding logic; (iii) The construction shown in some embodiments does not use two C-elements to drive the primary output-instead, C-elements are only used to implement the keeper circuit; and (iv) The robust C-element keepers shown are a novel construction, and the modification improves the SEE immunity of the logic.

There have thus been described new and improved methods and systems for designing asynchronous circuits that are tolerant to transient faults, for example of the type introduced through radiation or, more broadly, single-event effects. Configurations have been shown and described for combinational logic circuits, state-holding logic circuits and SRAM memory circuits.

While the invention has been shown and described with respect to particular embodiments, it is not thus limited. Numerous modifications, changes and enhancements within the scope of the invention will now occur to the reader.

What is claimed is:

1. A fault tolerant static random access memory (SRAM) circuit, comprising:
   a read circuit;
   a write circuit; and
   a staticizer circuit, comprising
      first and second C-elements each connected to each of the read and write circuits, and
      third and fourth C-elements each connected through inverters to an output of each of the first and second C-elements and to the read and write circuits, each inverter connecting a pair of the C-elements to physically space an input and output of the pair of the C-elements, the staticizer circuit configured to prevent a single write from changing an overall state of the SRAM circuit during a time-limited fault.

2. The circuit of claim 1 wherein each of the third and fourth C-elements comprises weak C-elements.

3. The circuit of claim 2 wherein the staticizer circuit is replicated to process outputs of N logic gates generating N output signals.

4. The circuit of claim 2 wherein at least one of the read and write circuits comprises a pair of series-connected transistors for each signal processing transistor of a plurality of signal processing transistors.

5. The circuit of claim 2 wherein at least one of the read and write circuits comprises a duplicate circuit connected in parallel with the at least one of the read and write circuits.

6. A method of providing a fault tolerant static random access memory (SRAM) circuit, comprising:

providing a read circuit;
providing a write circuit; and
providing a staticizer circuit, comprising
- first and second C-elements each connected to each of the read and write circuits, and
- third and fourth C-elements each connected through inverters to an output of each of the first and second C-elements and to the read and write circuits, eacj inverter connecting a pair of the C-elements to physically space an input and output of the pair of the C-elements, the staticizer circuit configured to prevent a single write from changing an overall state of the SRAM circuit during a time-limited fault.

7. The method of claim 6 wherein each of the third and fourth C-elements comprises weak C-elements.

8. The method of claim 7 further including:
replicating the staticizer circuit to process outputs of N logic gates to generate N output signals.

9. The method of claim 7 and further including:
configuring at least one of the read and write circuits as a pair of series-connected transistors for each signal processing transistor of a plurality of signal processing transistors.

10. The method of claim 7 further including:
duplicating at least one of the read and write circuits connected in parallel with the at least one of the read and write circuits.

* * * * *